United States Patent [19]

Asano

[11] Patent Number: 4,873,167
[45] Date of Patent: Oct. 10, 1989

[54] SELF CLEANING SHEET FOR DISSOLVING A PHOTO-SENSITIVE MATERIAL CONTAINING MICROCAPSULES ON BOTH SIDES OF SUBSTRATE

[75] Inventor: Yuji Asano, Nagoya, Japan

[73] Assignee: Brother Kogyo Kabushiki Kaisha, Aichi, Japan

[21] Appl. No.: 165,465

[22] Filed: Mar. 8, 1988

[30] Foreign Application Priority Data

Mar. 11, 1987 [JP] Japan .................................. 62-55795

[51] Int. Cl.$^4$ .......................... B41M 5/12; G03C 1/68
[52] U.S. Cl. .................................... 430/138; 427/150; 427/151; 427/146
[58] Field of Search ................ 430/138; 427/150, 151, 427/146; 106/21

[56] References Cited

U.S. PATENT DOCUMENTS

| | | | |
|---|---|---|---|
| 3,663,256 | 5/1972 | Miller et al. | 117/36.2 |
| 4,578,339 | 3/1986 | Adkins | 430/138 |
| 4,680,056 | 7/1987 | Komin | 430/138 |
| 4,705,736 | 11/1987 | Notley | 430/138 |
| 4,761,358 | 8/1988 | Hosoi et al. | 430/138 |

FOREIGN PATENT DOCUMENTS

| | | |
|---|---|---|
| 191617 | 2/1985 | European Pat. Off. |
| 204460 | 6/1985 | European Pat. Off. |
| 1390187 | 4/1975 | United Kingdom. |
| 1574237 | 9/1980 | United Kingdom. |
| 2113860 | 8/1983 | United Kingdom. |

Primary Examiner—Paul R. Michl
Assistant Examiner—Patrick A. Doody
Attorney, Agent, or Firm—Oliff & Berridge

[57] ABSTRACT

The disclosed is a cleaning sheet comprising second microcapsules, which encapsulate a solvent dissolvable of a photo-curable material, so that any radiation curable material sticking to a surface of a pressure roller member of a transfer imaging system will be efficiently cleaned away, thereby maintaining a constantly smooth surface of the pressure member which can then apply pressure onto the photo-pressure sensitive sheet uniformly, resulting in a unblemished transmittance of the original image.

7 Claims, 5 Drawing Sheets

SELF CLEANING SHEET FOR DISSOLVING A PHOTO-SENSITIVE MATERIAL CONTAINING MICROCAPSULES ON BOTH SIDES OF SUBSTRATE

BACKGROUND OF THE INVENTION

The present invention relates to a cleaning sheet which is particularly applied to an imaging system employing a photo-pressure sensitive sheet coated with microcapsules.

An imaging system conventionally employing a photo-pressure sensitive sheet containing microcapsules encapsulated with a chromogenic material and a photo-sensitive material such as a photo-curable material has been proposed and developed. The transfer imaging system works such that a sheet coated with encapsulates of a chromogenic material and a photo-curable material is exposed based on the image-wise information to an exposure means so that the microcapsules on the sheet are cured in the exposed area. Then a transfer sheet is pressed face to face against the photo-pressure sensitive sheet with pressure rollers, so that the unexposed, i.e., non-cured microcapsules are ruptured, and the effused encapsulated chromogenic material reacts with a developer on the transfer sheet, thereby forming an image. This system is depicted in U.S. Pat. No. 4,399,209. However, this transfer imaging system has a defect that the photo-curable material from the ruptured microcapsules occasionally leaks out from the edge of the photo-pressure sensitive sheet, which is pressed together with the transfer sheet, and sticks to the surface of the pressure roller. This leakage onto the pressure member results in an uneven surface thereof, which has tiny bumps thereon, resulting in that the pressure roller does not press the photo-pressure sensitive sheet and the transfer sheet together uniformly, thus reducing the quality of the final image. In order to remove such leakage of the photo-curable material, a brush, a blade, or such are devised to run along the roller in contact therewith while wiping up the leaked material. However, this mechanical removal does not clean the surface of the roller sufficiently, so problem of nonuniform pressure on the sheets remains, resulting in a blemished image.

SUMMARY OF THE INVENTION

It is the object of the present invention to provide a cleaning sheet which removes the photo-sensitive material such as the photo-curable material stuck on the surface of the pressure roller member.

According to the present invention, a self cleaning sheet comprising: first microcapsules encapsuling a photo-sensitive material which is exposed by light and ruptured by a pressure roller, and effuses from the first microcapsules; a sheet of substrate; and second microcapsules encapsulating a solvent of the photo-sensitive material and are at least coated on a first surface of the sheet of substrate.

The present invention is to be used in the transfer imaging apparatus in which the photosensitive sheet, coated with the first microcapsules containing therein at least the chromogenic material and the photo-sensitive material such as photo-curable material, is exposed with image-wise radiation and consequently pressed face to face against the transfer sheet by the pressure member so as to rupture the unexposed microcapsules, so that the chromogenic material effused therefrom reacts with the developer to eventually form the image of the original image information. The cleaning sheet now disclosed herein inherently comprises second microcapsules containing a solvent of the photo-curable material, which is also pressed by the pressure member of the transfer imaging apparatus. The second microcapsules of the cleaning sheet are ruptured by the pressure member, and the encapsulated solvent effuses. The released solvent leaks out from the edge of the sheet onto the surface of the pressure member, therefore dissolving the photo-curable material remaining on the surface thereof, sufficiently cleaning the pressure member.

BRIEF DESCRIPTION OF THE DRAWINGS

These and other object of the present invention will be more completely understood in conjunction with the attached drawings, in which:

FIGS. 1 through 4 depict the first embodiment of the present invention, the cleaning sheet, wherein FIG. 1 is an enlarged partial cross-section of the photo-pressure sensitive sheet;

FIG. 2 is a schematic of cross-sectional diagram of the transfer imaging apparatus employing the photo-pressure sensitive sheet to which the present embodiments are applied;

FIG. 3 is a perspective view of the pressure roller and its surroundings in the transfer imaging system;

FIG. 4 is a cross-sectional view of the photo-pressure sensitive sheet showing the second microcapsules being ruptured;

DETAILED DESCRIPTION OF THE PREFERRED EMBODIMENTS

Now disclosed are the preferred embodiments of the present invention, which will be seen in reference to the accompanying drawings.

Figure 1:
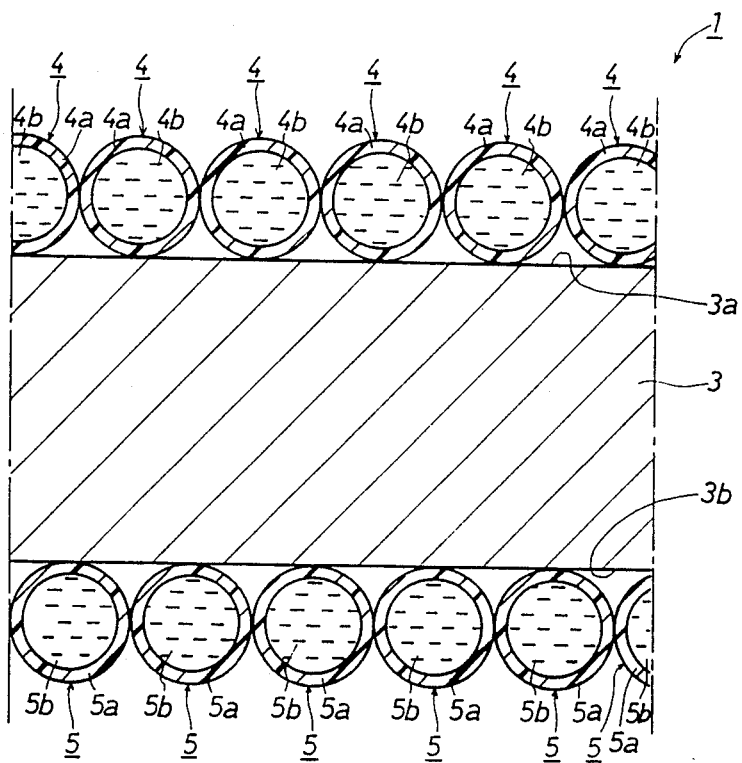

The first embodiment of the present invention is the photo-pressure sensitive sheet also serving as the cleaning sheet, which is shown in FIG. 1 in an enlarged cross-sectional view. First microcapsules 4 are coated on a surface 3a of a support substrate 3 made of paper. The first microcapsule 4 comprises an exterior 4a and a liquid substance 4b encapsulated therein. The liquid substance 4b contains a chromogenic material reactive with a developer-coated layer on a surface of a transfer paper, and a photo-curable material which is cured by light. Further, second microcapsules 5 are coated on the opposite surface 3b of the support substrate 3. The second microcapsule 5 comprises an exterior 5a and a liquid substance 5b similarly to the first microcapsule, and the liquid substance 5b includes a solvent of the photo-curable material.

The first microcapsule 4 is produced by conventional methods such as a coacervation method, an interfacial polymerization method, and so on, by which the chromogenic material and the photo-curable material are encapsulated therein. The exterior 4a of the first microcapsule 4 is made up from organic compounds, mainly including anhydrous polymers.

The aforementioned chromogenic material is composed of one of, or more compounds of, for example, triarylmethane compound, bisphenylmethane compound, xanthene compound, thiazine compound, spiropyran compound. The photo-curable materials adopt, for example, a photopolymerizable resin, more particularly an ethylenically unsaturated compound such as a trimethylolpropane, and an acrylate prepolymer. These compounds are activated in the presence of photopolymerization initiator, which initiates polymerization of resin compounds responsive to light. The suitable photopolymerization initiators are benzoilalkylethers such as a benzophenone, a benzoylisopropylether, or Michler's ketone, 2,4-diethylthioxanton, or so on.

The second microcapsule is produced to contain in its inner phase isopropyl alcohol as a solvent dissolving the photo-curable material. The exterior of the microcapsule is made up from inorganic material such as a silicate calcium, a silica, and a calcium carbonate.

The second microcapsules are manufactured in the method following below:

First, 100 ml of a 4 mol/l concentrated sodium silicate solution is added to 50 g of an isopropyl alcohol solution in which 2 wt % of polyoxyethylene sorbitanmonooleate (HLB=15.0) is dissolved, forming an oil-in-water type (O/W-type) emulsion which two phases are stirred and mixed. Further, 500 ml of a benzene solution in which 3 wt % mixture of sorbitanmonostearate (HLB=4.7) and polyoxyethylene sorbitanmonostearate (HLB=15.0) 1:2 by weight, respectively, is dissolved, is added to the O/W-type emulsion prepared beforehand so that, after shaking and mixing, an O/W/O-type emulsion is obtained. This O/W/O-type emulsion is added to 1000 ml of a 1.5 mol/l calcium chloride solution which is stirred during their reaction. After the reaction, the solution is filtered, rinsed, and dried in room temperature for 24 hours, so that 105 g of light-yellow silicate calcium type microcapsules containing isopropyl alcohol in the inner phase thereof are produced.

The solvent of the radiation curable material can be not only isopropyl alcohol, but butanol, ethyl alcohol, propyl alcohol, methyl alcohol, acetone, ethyl ketone, methyl ketone, and so on.

Figure 2:
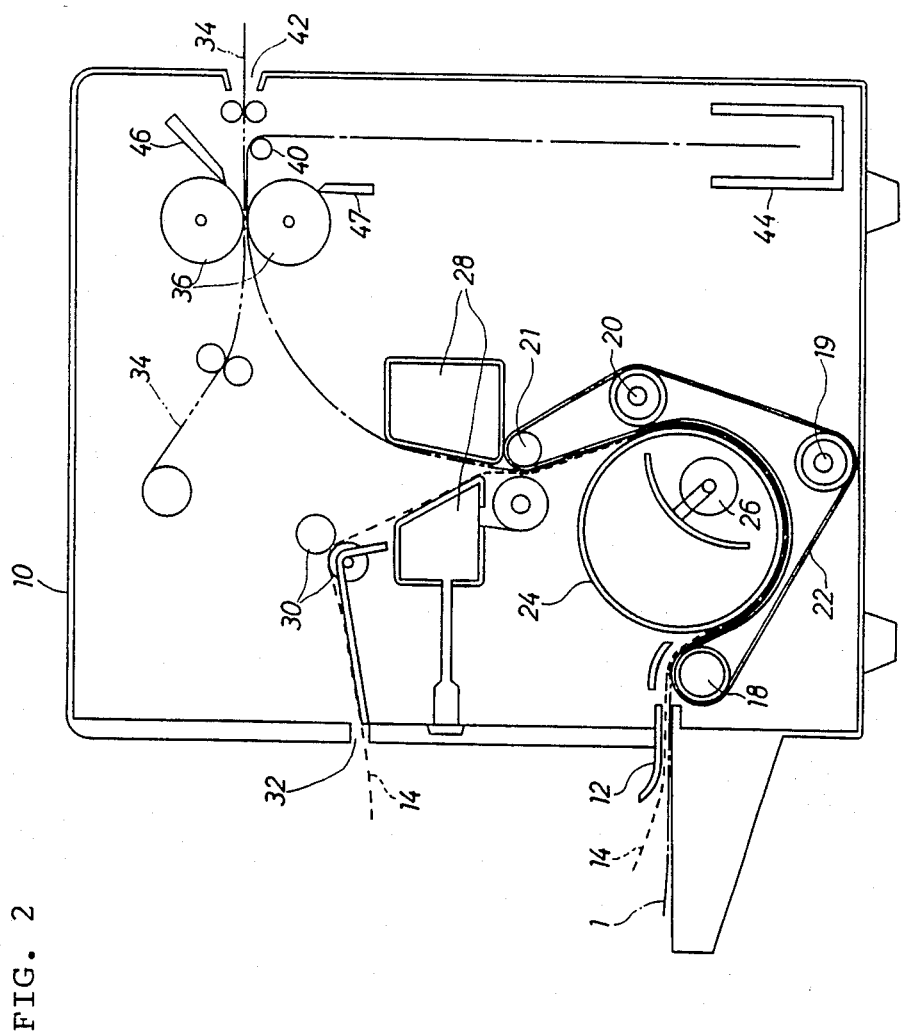
Figure 3:
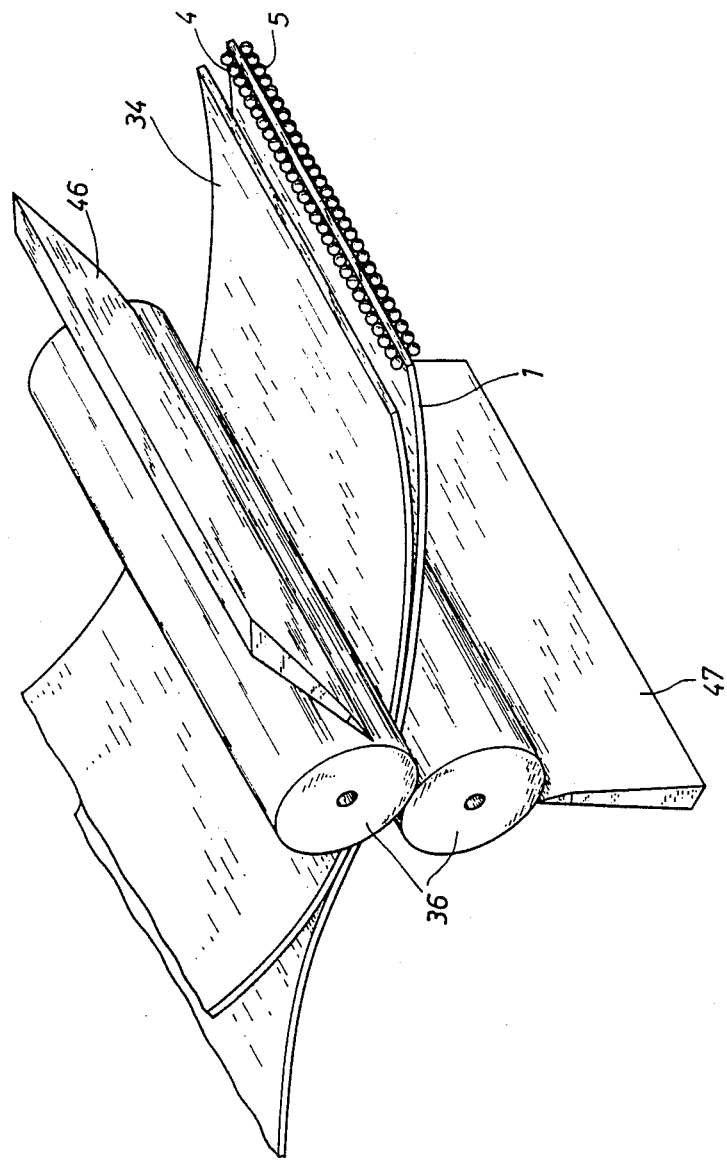
Figure 4:
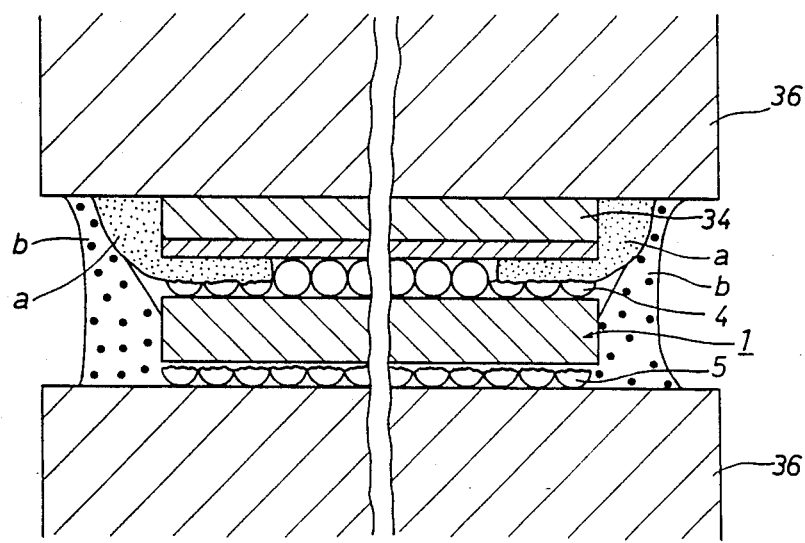
Figure 5:
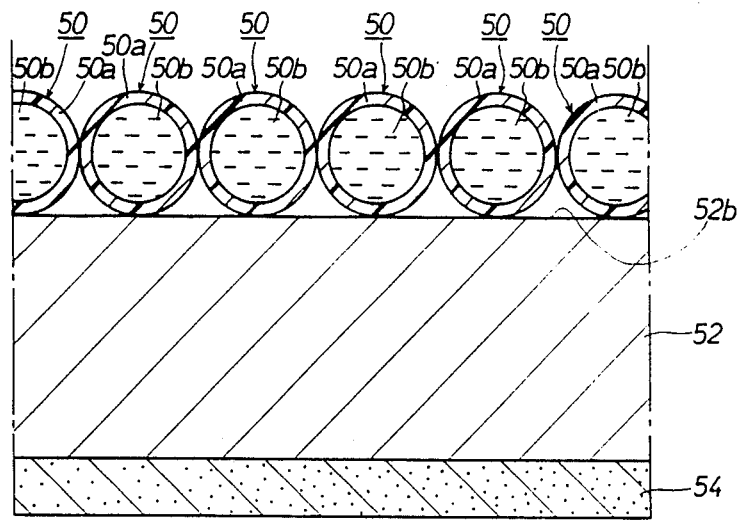
FIG. 5 depicts the second embodiment of the present invention; an enlarged cross-section of the transfer sheet; and, FIG. 6 depicts the third embodiment of the present invention, an enlarged cross-section of the photo-pressure sensitive sheet.

Next, we refer to how the first embodiment of the present invention, the photo-pressure sensitive sheet 1 constituted in the aforementioned manner, is applied to the transfer imaging system. As illustrated in FIG. 2, an entrance 12 is provided at a lower portion of one side of a body casing 10. The photo-pressure sensitive sheet 1 and the original document 14 are inserted together at the entrance 12 in the manner that the original document 14 lays against one side of the photo-pressure sensitive sheet 1 on which the first microcapsules 4 are coated. The two sheets are introduced between a drum 24 and a band-like belt 22 running over four rollers 18, 19, 20 and 21, as illustrated in the drawing. The drum 24 is transparent and of cylindrical shape. The photo-pressure sensitive sheet 1 is exposed while the drum rotates by a straight angle, by means of the radiation source 26 installed inside the drum 24. Next, a separator 28 separates the two sheets, the original document 14 from the photo-pressure sensitive sheet 1, and then the original document 14 is set by a pair of paper-advancing rollers 30 toward an original document outlet 32. After such separation of the two sheets, the photo-pressure sensitive sheet 1 comes into contact with a transfer sheet 34 coated with developer, and these two sheets are pressed from both sides with a pair of pressure rollers 36, as shown in FIG. 3. Referring back to FIG. 2, a roller 40 helps separate the photo-pressure sensitive sheet 1 and the transfer sheet 34 from each other, and the transfer sheet 34 is then discharged through outlet 42. The photo-pressure sensitive sheet 1 is temporarily stored in the container 44, and will eventually be discarded. Additionally blades 46 and 47 are provided in contact with the surface of pressure rollers 36 as shown in FIG. 3.

Set forth below is next concerned with the exposure and developing process of the photo-pressure sensitive sheet 1. As mentioned in the previous paragraph, the photo-pressure sensitive sheet 1 is exposed by the light source 26 with the original document 34 placed therebetween. Upon exposure, the photopolymerization initiator is activated so as to cure the photo-curable resin in the inner phase of the first microcapsules 4 in the exposed area. As a result, the first microcapsules 4 in the exposed area are cured, while the other first microcapsules 4 unexposed remain soft. After next being pressed between the pressure rollers 36, only the unexposed and soft first microcapsules 4 are ruptured so that the chromogenic material contained therein effuses and reacts with the developer coated on the transfer sheet 34. Thus the reaction results in the realization of image information. In this way, the image on the original document 34 is transmitted onto the transfer sheet 34.

Obviously, when being pressed by the pressure rollers 36, the second microcapsules 5 coating the surface 3b of the photo-pressure sensitive sheet 1 are ruptured as well, and accordingly the solvent b contained in their inner phase effuses, some leaking out from the sheets onto the surface of pressure roller 36. This leaked solvent b prepared in the second microcapsules 5 will dissolve any photo-curable material leaked from the first microcapsules 4 onto pressure rollers 36. Next, the blades 46 and 47 wipe the surface of the pressure rollers 36 clean. Therefore, by virtue of the present invention, nonuniform pressure due to the unsmooth surface with small bumps of remaining photo-curable material is eliminated, and the photo-pressure sensitive sheet 1 and the transfer sheet 34 can be pressed together uniformly, resulting in an unblemished image.

Alternatively, the solvent utilized here can dissolve not only the photo-curable material but also other material contained in the first microcapsules 4, such as inactive oil, achromatic dye, photopolymerization initiator, and so on, for more thorough cleaning.

Next, the second embodiment of the present invention is disclosed. Compared with the first embodiment wherein the second microcapsules 5 containing the photo-curable material dissolvable solution are coated on the surface of the photopressure sensitive sheet 1, in the second embodiment, the second microcapsules 50 coat the surface of the opposite side 52b of the transfer sheet 52, opposite the side coated with the developer 54. The second microcapsule 50 is composed similarly to the second microcapsule 5 used in the first embodiment. In a manner similar to that of the first embodiment, the second microcapsules 50 on the transfer sheet 52 are ruptured by the pressure imposed by the pressure roller, so that any photo-curable material on the surface of the pressure roller can be dissolved by the solvent contained in the second microcapsules, thus cleaning the pressure roller sufficiently.

Figure 6:
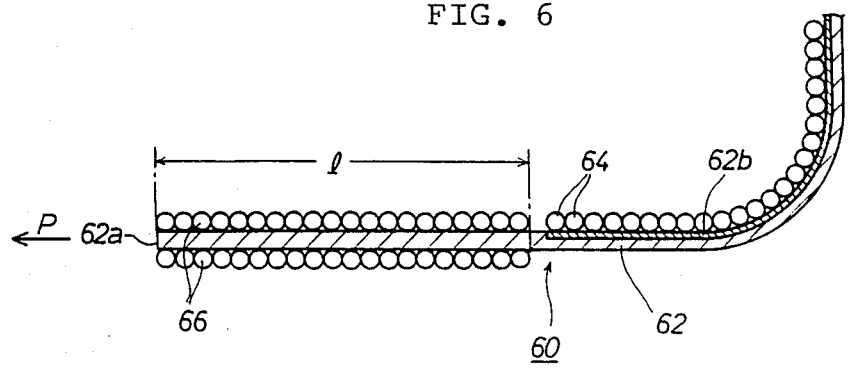

Further disclosed is the third embodiment of the present invention, which is a web of self-developable photo-pressure sensitive sheet as shown in FIG. 6. This sheet is depicted in U.S. Pat. No. 4,440,846. The developer is coated on the surface 62b of the sheet 62 except for a predetermined distance 1 from one edge 62a of the sheet 62. The first microcapsules 64 produced as in the first embodiment are laid on the developer layer. The second microcapsules 66 are provided on both sides of the sheet 62 in the portion 1 as illustrated in FIG. 6, so that a cleaning effect similar to the first and second embodiments is accomplished on the surface of the pressure roller when the portion 1 of the sheet 62 runs therealong. The arrow P indicates a feeding direction of the paper.

Obviously, many modifications and variations of the present invention are possible with regard to the above teachings. For example, the third embodiment may be modified such that the second microcapsules 66 are coated on some top portion of the sheet. Or another independent sheet, coated with second microcapsules 66 containing the solvent, may be specially prepared to conduct cleaning. It is therefore to be understood that within the scope of the appended claims, the invention may be practiced other than as specifically described.

What is claimed is:

1. A self cleaning sheet comprising:
    a sheet of substrate; and
    microcapsules enveloping a solvent of a photo-curable material and being coated on said sheet of substrate, said solvent selected from the group consisting of isopropyl alcohol, butanol, ethyl alcohol, propyl alcohol, methyl alcohol, acetone, ethyl ketone and methyl ketone.

2. A self cleaning sheet according to claim 1 wherein an exterior of said microcapsules is composed of inorganic material.

3. A self cleaning sheet comprising a sheet of substrate having a first face and a second face opposite to each other wherein:
    said first face has thereon first microcapsules enveloping a first reaction component for an image developing reaction and a photo-curable material which advances mechanical breaking strength of the microcapsules in response to exposure to light; and
    said second face has thereon second microcapsules enveloping a solvent of said photo-curable material.

4. A self cleaning sheet according to claim 3 wherein said first face has thereon a second reaction component which comes in contact with said first reaction component and reacts therewith, thereby changing color of said first face.

5. A self cleaning sheet comprising a sheet of substrate having a first face and a second face opposite to each other wherein:
    said first face has thereon developer which comes in contact with a first reaction component and reacts therewith, thereby changing color of said first face; and
    said second face has thereon second microcapsules enveloping a solvent of the photo-curable material.

6. A self cleaning sheet comprising a sheet of substrate having a first portion and a second portion on the same side of the substrate wherein:
    said first portion has thereon first microcapsules enveloping a first reaction component for an image developing reaction and a photo-curable material which advances mechanical breaking strength of the microcapsules in response to exposure to light; and
    said second portion has thereon second microcapsules enveloping a solvent of said photo-curable material.

7. A self cleaning sheet comprising a sheet of substrate having a first portion and a second portion on the same side of the substrate wherein:
    said first portion has thereon developer which comes in contact with a first reaction component and reacts therewith, thereby changing color of said first portion; and
    said second portion has thereon second microcapsules enveloping a solvent of the photo-curable material.

* * * * *